Figure 1:
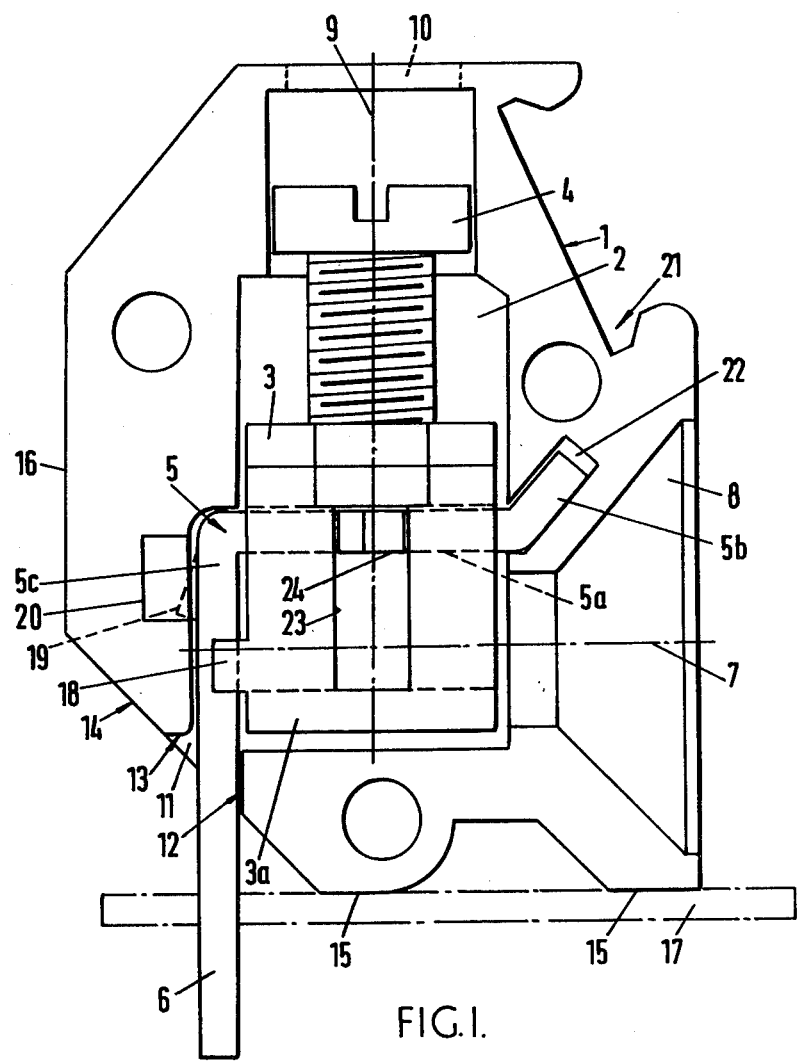

United States Patent [19]

Geiseler

[11] 4,171,152
[45] Oct. 16, 1979

[54] TERMINAL FOR PRINTED CIRCUITS

[75] Inventor: Norbert Geiseler, Detmold, Fed. Rep. of Germany

[73] Assignee: C. A. Weidmuller KG, Detmold, Fed. Rep. of Germany

[21] Appl. No.: 926,984

[22] Filed: Jul. 21, 1978

[30] Foreign Application Priority Data

Aug. 13, 1977 [DE] Fed. Rep. of Germany ....... 2736620

[51] Int. Cl.² .............................................. H01R 9/10
[52] U.S. Cl. ............................... 339/272 A; 339/17 C; 339/198 G
[58] Field of Search ......... 339/17 C, 198 G, 198 GA, 339/272 R, 272 A, 198 R

[56] References Cited

U.S. PATENT DOCUMENTS 3,496,521 2/1970 Hohorst ........................... 339/272 R
4,027,937 6/1977 Norden ........................... 339/272 A

FOREIGN PATENT DOCUMENTS 1211057 11/1970 United Kingdom ................ 339/272 R Primary Examiner—Joseph H. McGlynn
Attorney, Agent, or Firm—Pollock, Vande Sande & Priddy

[57] ABSTRACT

An electrical terminal for printed circuits comprises an insulating casing, clamping means and a clamping screw for connection of an external conductor, and a tag projecting from the casing for connection to the printed circuit. The casing has external surfaces parallel respectively to the axis of the clamping screw and the direction of insertion of an external conductor, normally at right angles, and an intervening oblique surface through which the tag projects. By fitting alternative tag members the terminal can be mounted to the printed circuit in different positions.

13 Claims, 3 Drawing Figures

TERMINAL FOR PRINTED CIRCUITS

This invention relates to electrical terminals for connecting conductors to printed circuits.

Terminals with screw-clamping means for connecting an external conductor to a tag which projects from an insulating casing of the terminal for connection to a printed circuit are well known. The projecting tags in normal use extend through holes in the printed circuit board and are secured by soldering. Two types of terminal are commonly used. In one, the axis of the clamping screw is perpendicular to the circuit board and the conductor is inserted into the terminal parallel to the circuit board. In the other, the axis of the screw and the conductor are both at 45° to the circuit board.

The need to make and stock two different types of terminal is inconvenient and costly. It is therefore an object of the present invention to provide a terminal capable of being mounted on a printed circuit board in a polarity of different positions including those mentioned above.

According to the present invention there is provided an electrical terminal for printed circuits, comprising an insulating casing with an internal space, a connector bar in the internal space of the casing having at an end thereof a tag projecting from the casing, through a first aperture provided in the casing, for connection to a printed circuit, and clamping means in the internal space of the casing for clamping an external conductor to the connector bar, said clamping means including a clamping screw, the casing being provided with a second aperture for insertion of a said external conductor, and having a first external surface substantially parallel to the axis of the clamping screw and opposite the said second aperture, a second external surface substantially parallel to the insertion direction for an external conductor, and a third external surface disposed between, adjoining, and oblique with respect to the said first and second surfaces, the first aperture being in the said third external surface and being defined by surfaces in the casing which are respectively substantially parallel to the first and second external surfaces and diverge towards the third external surface of the casing.

Depending on the angle at which the tap projects from the casing, the terminal according to the present invention can be mounted on a printed circuit board with any one of the first, second and third surfaces adjacent to the board thereby providing for different positions of the external conductor and clamping screw with respect to the board. To allow for these different mounting positions it is only necessary to provide alternative connector bars with differently oriented tags, or for the user to bend the tag to the desired orientation, which will in general be perpendicular to that external surface of the casing that is to lie against the printed circuit board.

In a preferred arrangement, the aforesaid axis and direction, and hence the first and second external surfaces of the casing, are perpendicular to one another, and the third external surface is at 45° to each of the first two surfaces.

The manufacture and stock-keeping of terminals for printed circuits is thus greatly simplified.

Figure 2:
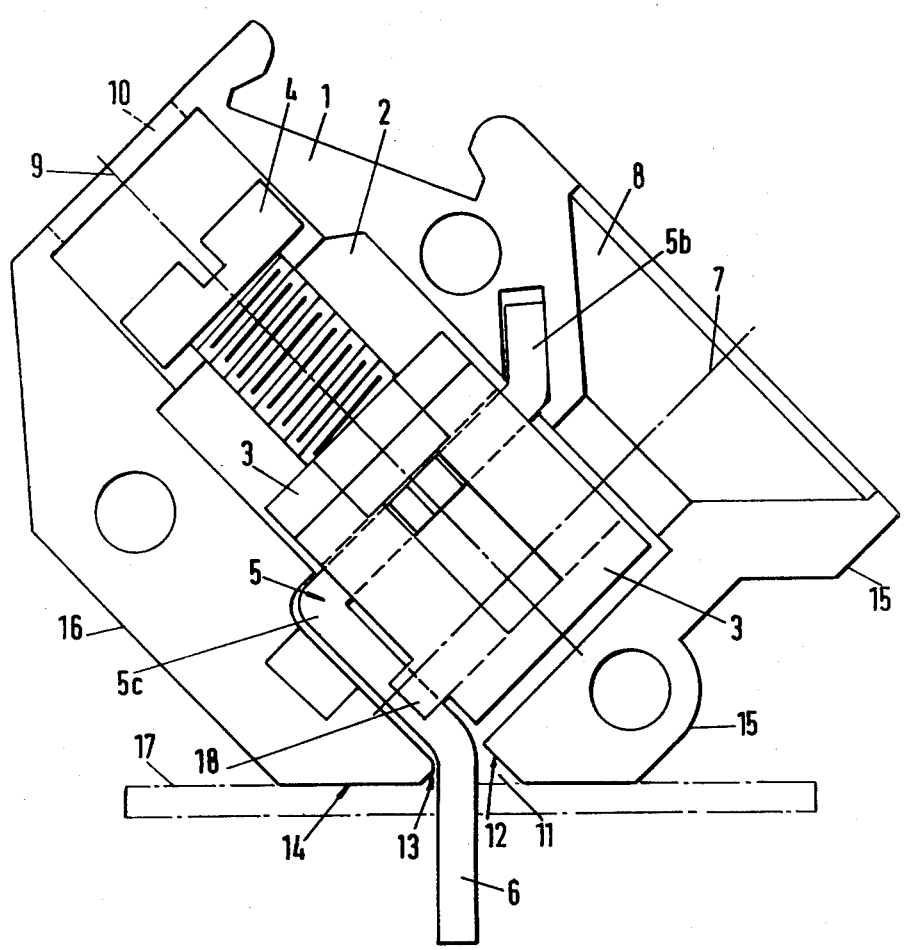
Figure 3:
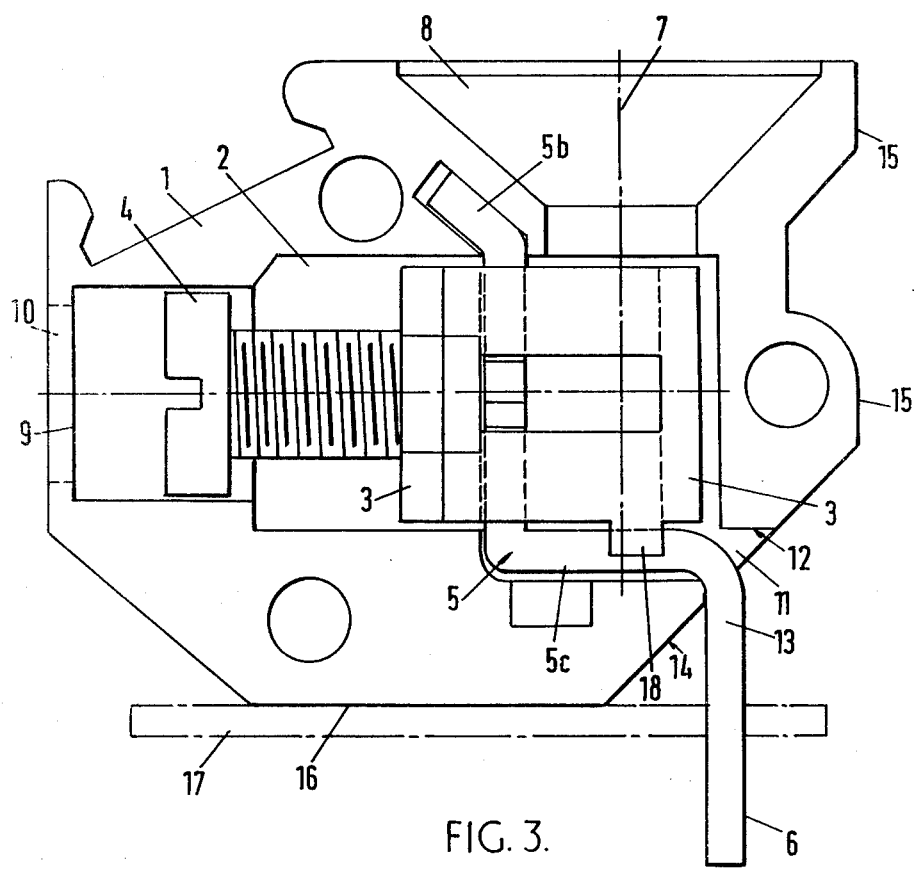

The invention will be further described with reference to the accompanying drawings, in which:

FIGS. 1 to 3 are side views of a terminal according to the invention, in three different positions of use.

FIG. 1 shows an electrical terminal for a printed circuit, mounted on a printed circuit board shown schematically at 17. The terminal has a casing 1 of moulded insulating plastics material. The casing is generally slab-like in shape, with a generally rectangular internal space 2 which is open to one of the major external faces of the casing. This space accommodates the conducting components of the terminal and in use is closed by the casing of an adjacent terminal, or a separate cover plate. The casing has a recess 21 to accommodate identifying plates.

The internal space 2 of the casing contains a clamping saddle 3 of bent sheet metal, a clamping screw 4 which is threaded in one side of the saddle, and a connector bar 5 extending through the saddle and adjacent to the tip of the screw. The saddle 3 is preferably sheet metal bent to form a tube of generally rectangular cross section, and is capable of moving within the space 2, in a direction perpendicular to the intermediate part 5a of the connector bar which lies within the saddle. One open end of the saddle faces an aperture 8 through which an external electrical conductor (not shown) can be inserted into the saddle, between the bottom wall 3a of the latter, and the intermediate part 5a of the connector bar. By tightening of the clamping screw, the clamping saddle 3 is moved along the screw so that the inserted conductor is clamped between the bottom 3a of the saddle and the portion 5a of the connector bar, the latter remaining fixed in position. The axis of the end of the inserted conductor, during insertion and when clamped, extends along or parallel to the chain line 7. The head of the screw is accessible through a further opening 10 in the casing.

The external surfaces of the casing in which the openings 8 and 10 are provided are perpendicular to one another, as are the direction of insertion of the conductor indicated by the line 7, and the axis 9 of the screw. The casing also has an external surface 15 (which in the illustrated embodiment is a pair of co-planar surface portions) parallel to the line 7 and opposite the surface containing the opening 10; an external surface 16 parallel to the screw axis 9 and opposite the surface containing the opening 8; and an external surface 14 which is intermediate between the surfaces 15 and 16 and directly adjoins each of the said surfaces and is at an angle of 45° thereto.

An opening 11 extends between the surface 14, and that corner of the internal space 2 that is closest to the surface 14. The opening 11 has a boundary surface 12 parallel to the axis 9 and the surface 16, and a boundary surface 13 parallel to the lines 7 and the surface 15. The surfaces 12 and 13 diverge towards the surface 14.

The connector bar has, in addition to the intermediate portion 5a, and end portion 5b which is bent obliquely away from the portion 5a and extends away from the line 7 and is located in a corresponding recess 22 in the casing. The connector bar also has a second end portion 5c bent at right angles to the portion 5a and extending, parallel to the axis 9, to the opening 11. A tag 6 integral with the end portion 5c projects through the opening 11 for insertion into and connection to the printed circuit board 17.

The saddle 3 may have one or more guide lugs 18 locating the end portion 5c of the connector bar, and may have a guide slot 23 which engages a guide lug 24 on the intermediate portion 5a of the connector bar, whereby the saddle is guided during its movement along the clamping screw when the latter is rotated.

The portion 5c of the connector bar may have a locating projection 19 which is located in a recess 20 in the casing.

FIG. 1 shows the terminal mounted with the surface 15 against the circuit board 17, the tag 6 being collinear with the end portion 5c of the connector bar so as to project perpendicularly through the circuit board. In this arrangement the end of the external conductor is parallel to the circuit board, and the axis of the clamping screw is perpendicular to the circuit board, being accessible from above the board.

FIG. 2 shows an alternative arrangement in which the tag 6 is at 45° to the end portion 5c and is accordingly at right angles to the surface 14. The latter surface rests against the circuit board 17 so that the tag 6 is perpendicular to the latter, and both the clamping screw axis and the conductor insertion direction are at 45° to the circuit board.

In FIG. 3, the tag 6 is bent at right angles to the end portion 5c of the connector bar 5 and the surface 16 of the casing rests against the circuit board 17, so that the axis of the clamping screw is parallel to the circuit board, and the external conductor is inserted in a direction perpendicular to the circuit board.

It will be seen that identical casings, clamping screws and clamping saddles are used for all three mounting positions, and the connector bars differ only in the orientation of their tags 6. Connector bars of the three different shapes can be prefabricated for installation in the terminals as required, and/or the tags can be bent to the required position by the user.

The casing is provided, in the conventional manner, with means for inter-linking adjacent terminals to form groups or blocks of terminals, and intermediate plates may be provided for connection to the casing to compensate for differences in the thicknesses of the casings and the spacing of the apertures provided in the circuit board to receive the connecting tags of the terminals.

I claim:

1. An electrical terminal for printed circuits, comprising an insulating casing with an internal space, a connector bar in the internal space of the casing having at an end thereof a tag projecting from the casing, through a first aperture provided in the casing, for connection to a printed circuit, and clamping means in the internal space of the casing for clamping an external conductor to the connector bar, said clamping means including a clamping screw, the casing being provided with a second aperture for insertion of a said external conductor, and having a first external surface substantially parallel to the axis of the clamping screw and opposite the said second aperture, a second external surface substantially parallel to the insertion direction for an external conductor, and a third external surface disposed between, adjoining, and oblique with respect to the said first and second surfaces, the first aperture being in the said third external surface and being defined by surfaces in the casing which are respectively substantially parallel to the first and second external surfaces and diverge towards the third external surface of the casing.

2. A terminal as claimed in claim 1 in which the tag is integral with the connector bar.

3. A terminal as claimed in claim 1 in which the said axis and said direction are substantially perpendicular to one another.

4. A terminal as claimed in claim 3 in which the said third external surface is at 45° to the said axis and direction.

5. A terminal as claimed in claim 1, in which the first aperture extends from a corner of the said internal space of the casing.

6. A terminal as claimed in claim 5 in which the said space is generally rectangular.

7. A terminal as claimed in claim 1 in which the connector bar has an intermediate portion associated with the clamping means and generally parallel to the said direction of insertion of an external conductor, a first end portion bent away from the said intermediate portion and away from the said insertion direction, and a second end portion bent away from the intermediate portion and extending generally parallel to the said axis, the tag being the said second end portion.

8. A terminal as claimed in claim 7 in which the tag is collinear with the said second end portion.

9. A terminal as claimed in claim 7 in which the tag is perpendicular to the said second end portion.

10. A terminal as claimed in claim 7 in which the tag is at 45° to the said second end portion.

11. A terminal as claimed in claim 7 in which the clamping means comprise a clamping saddle embracing the said intermediate portion and provided with a guide lug which locates the second end portion of the connector bar.

12. A terminal as claimed in claim 7 in which a locating projection is provided on the said second end portion of the connector bar and the casing contain a recess which locates the said projection.

13. A terminal as claimed in claim 7 in which the first end portion of the connector bar is located in a corresponding recess provided in the casing.

* * * * *